United States Patent
Komori et al.

(10) Patent No.: US 9,876,045 B2
(45) Date of Patent: Jan. 23, 2018

(54) BACK SIDE ILLUMINATED CMOS IMAGE SENSOR ARRAYS

(71) Applicant: CISTA SYSTEM CORP., San Jose, CA (US)

(72) Inventors: Hirofumi Komori, San Jose, CA (US); Jingyi Bai, San Jose, CA (US)

(73) Assignee: CISTA SYSTEM CORP., Grand Cayman (KY)

( * ) Notice: Subject to any disclaimer, the term of this patent is extended or adjusted under 35 U.S.C. 154(b) by 0 days.

(21) Appl. No.: 15/134,181

(22) Filed: Apr. 20, 2016

(65) Prior Publication Data

US 2016/0329367 A1 Nov. 10, 2016

Related U.S. Application Data

(60) Provisional application No. 62/157,636, filed on May 6, 2015.

(51) Int. Cl.
*H01L 27/146* (2006.01)

(52) U.S. Cl.
CPC .... *H01L 27/1464* (2013.01); *H01L 27/14621* (2013.01); *H01L 27/14627* (2013.01); *H01L 27/14643* (2013.01); *H01L 27/14685* (2013.01)

(58) Field of Classification Search
CPC ............. H01L 27/1464; H01L 27/1463; H01L 27/14636; H01L 27/14621; H01L 27/14643; H01L 27/14685; H01L 27/14627
USPC ........................................ 257/292, 297, 432
See application file for complete search history.

(56) References Cited

U.S. PATENT DOCUMENTS

| | | | |
|---|---|---|---|
| 5,625,210 A | 4/1997 | Lee et al. | |
| 7,728,277 B2 | 6/2010 | Stevens et al. | |
| 8,183,603 B2 | 5/2012 | Yamaguchi et al. | |
| 8,618,458 B2 | 12/2013 | McCarten et al. | |
| 2009/0020795 A1* | 1/2009 | Doi | H01L 27/14689 257/292 |
| 2010/0270636 A1* | 10/2010 | Huang | H01L 27/14627 257/432 |
| 2011/0057279 A1* | 3/2011 | Lee | H01L 27/14609 257/432 |
| 2011/0139239 A1* | 6/2011 | Lee | H01L 31/022433 136/256 |

(Continued)

OTHER PUBLICATIONS

Stevens et al., "Low-crosstalk and low-dark-current CMOS image-sensor technology using a hole-based detector", Proc. IEEE ISSCC, 2008, pp. 60-61,595.

*Primary Examiner* — Marc Armand
*Assistant Examiner* — Sue Tang

(57) ABSTRACT

An image sensor including at least one pixel for collecting charge in its photodiode is provided. The image sensor comprises: a substrate having a first surface on a front side and a second surface on a back side, a photodetector formed in the silicon substrate and having a light-receiving surface on the second surface, and a first layer with positive charges disposed on the second surface, the first layer being configured to form an electron accumulation region at the light-receiving surface of the photodetector for suppressing a dark current at a back side interface of the image sensor. A method for fabricating an image sensor including a first layer with positive charges is also provided.

17 Claims, 7 Drawing Sheets

(56) References Cited

U.S. PATENT DOCUMENTS

2013/0321680 A1* 12/2013 Kumano .......... H01L 27/14634
348/273
2014/0055655 A1* 2/2014 Kokubun ............... H04N 5/374
348/308

* cited by examiner

BACK SIDE ILLUMINATED CMOS IMAGE SENSOR ARRAYS

RELATED APPLICATION(S)

This application claims priority to U.S. Provisional Patent Application No. 62/157,636, filed on May 6, 2015, the contents of which are hereby incorporated by reference in its entirety.

TECHNICAL FIELD

The present disclosure generally relates to the field of solid-state image sensor arrays, particularly to small pixel CMOS image sensor arrays with reduced dark current for back-illuminated CMOS image sensor pixel structure.

BACKGROUND

A typical image sensor senses light by converting photons into electrons or holes that are integrated (collected) in sensor pixels, when the sensor is exposed to light. After completion of an integration cycle, the collected charges are converted into a voltage, which can then be output at the output terminals of the sensor. In CMOS image sensors, the charge-to-voltage conversion is accomplished directly at a pixel device, and the resulting analog pixel voltage is then transferred to the output terminals through various pixel addressing and scanning schemes. The analog signal can be also converted on-chip to a digital equivalent signal before reaching the chip output. Typically, a pixel device is also coupled with a buffer amplifier (e.g., a Source Follower (SF)), which drives the sense lines with the digital equivalent signal that are connected to the pixels by suitable addressing transistors. After the charge-to-voltage conversion is completed, and the resulting signal is transferred out from the pixels, the pixels can be reset for accumulation of new charges in a new exposure.

In pixels that use Floating Diffusion (FD) as a charge detection node, the reset is accomplished by turning on a reset transistor that charges the FD node to a reference voltage. While the resetting removes the collected charges, it also generates kTC-reset noise. The kTC-reset noise can be removed by Correlated Double Sampling (CDS) signal processing technique in order to achieve the desired low noise performance.

The typical CMOS image sensors that utilize the CDS concept usually require three transistors (3T) or four transistors (4T) in the pixel, one of which serves as the charge transferring (TX) transistor. It is possible to share the drain or source terminals of the pixel circuit transistors among several photodiodes to reduce the pixel size. To avoid light from being blocked by the metal interconnects and electrodes of the devices coupled to the pixel (e.g., the reset transistor, the charge transferring transistor, etc.), a back-illuminated CMOS image sensor pixel structure can be used, where light is incident on a side of the substrate that is different from the side where the metal interconnects and electrodes are located.

Besides kTC-reset noise, another noise source of an image sensor device is dark current. Dark current refers to an electric current that flows through the sensor device when no photons enter the device. One source of dark current is due to interface trapping. A solid-state image sensor device is typically fabricated on a silicon substrate. The device typically includes insulator layers (e.g., silicon dioxide). There are typically electrically active defects located at the interface between the insulator and the silicon. Those defects can trap charges. The trapping of the charges can lead to a generation of charge carriers not converted from photons. Since the dark current can add charge carriers that are not generated by incident light photons, the dark current does not correlate with the sensed light, and the accuracy of the image sensor will be degraded as a result.

An example of a back-illuminated CMOS image sensor pixel structure 100 under the current technology is shown in FIG. 1. For the rest of disclosure, "n region" or "n layer" refers to a region that includes n-type dopants, while "p region" or "p layer" refers to a region that includes p-type dopants. Moreover, an "n+ region" refers to a region that has a higher concentration of n-type dopants than an "n region", which has a higher concentration of n-type dopants than an "n− region." Moreover, a "p+ region" refers to a region that has a higher concentration of p-type dopants than a "p region", which has a higher concentration of p-type dopants than a "p− region."

As shown in FIG. 1, CMOS image sensor pixel structure 100 includes a plurality of pixel regions including, for example, a p+ floating diffusion region 104, a p region 105, and a first charge transfer gate 110. CMOS image sensor pixel structure 100 also includes a second charge transfer gate 112 and a p+ region 113. Both p+ floating diffusion region 104 and p+ region 113 are in an n-well 109 and, together with second charge transfer gate 112, can form a PMOS device.

As to be discussed below, photons can enter CMOS image sensor pixel structure 100 when the pixel structure 100 is exposed to light, which can lead to formation of positive charges in p region 105. A FD1 terminal can be connected to p+ floating diffusion region 104 on a front side of CMOS image sensor pixel structure 100, and a TX1 terminal can be connected to first charge transfer gate 110 on the front side. During the integration cycle, a voltage can be applied to TX1 terminal to enable a transfer of the charges formed in p region 105 to p+ floating diffusion region 104. Charges stored at the parasitic capacitors of p+ floating diffusion region 104 can develop a voltage. Terminal FD1 can be connected to a buffer amplifier (e.g., a Source Follower (SF)), which can be configured to sense the voltage developed at p+ floating diffusion region 104, and to drive the sense lines with a digital signal equivalent to the sensed voltage.

Moreover, a GND1 terminal can be connected to p+ region 113 on the front side, and a RST1 terminal can be connected to second charge transfer gate 112 on the front side. GND1 terminal can be connected to a fixed bias voltage with a value of, for example, zero volts. At the end of the integration cycle, a voltage can be applied to RST1 terminal to enable a transfer of the charges in p+ floating diffusion region 104 to p+ region 113, to reset p+ floating diffusion region 104 for accumulation of new charges in the next integration cycle.

As shown in FIG. 1, CMOS image sensor pixel structure 100 further includes a silicon substrate 106 that includes an n+ layer 102 implanted in a back side that is opposite to the front side, with the dopants of the n+ layer 102 activated by, for example, laser annealing. The front side of silicon substrate 106 is covered by an oxide layer 107 configured to isolate first charge transfer gate 110 from the sensor layer 106. A front side interface 101a is formed between oxide layer 107 and silicon substrate 106. Silicon substrate 106 further includes a p− region 103 situated above the n+ layer 102. Silicon substrate 106 further includes an n+ potential pinning layer 108 above p region 105. A photodiode (PD)

can be formed between, for example, a p region including p– region 103 and a p region 105, and an n region including n+ potential pinning layer 108.

CMOS image sensor pixel structure 100 further includes, on the back side, an insulating layer 114, an anti-reflecting layer 115, color filter elements 116, and a micro lens 117. Anti-reflecting layer 115, color filter elements 116, and micro lens 117 are configured to control one or more attributes of light that enters silicon substrate 106. For example, micro lens 117 can focus the incident light. Color filter elements 116 can control which color components of the light can enter silicon substrate 106. Anti-reflecting layer 115 prevents the reflection of light, to reduce the incident light loss. Insulating layer 114 further insulates silicon substrate 106 from the external environment around the back surface. A back side interface 101b is formed between insulating layer 114 and n+ layer 102.

Photons can enter CMOS image sensor pixel structure 100 from the back surface of the sensor layer 106 through micro lens 117, color filter elements 116, anti-reflecting layer 115 and insulating layer 114. The photons can generate carriers in the p– region 103, and the charges of these carriers are collected in the potential well of the photodiode (PD) formed in p region 105. The charges can then be transferred, via charge transfer gate 110, to the floating diffusion region 104.

The n+ layer 102 can provide negative charges that can combine with the traps at back side interface 101b, thereby preventing the p-type carriers in p– region 103, activated by the photons, from combining with the traps. As a result, the number of the generated carriers at p– region 103 can reflect more accurately the amount of photons received. Further, the n+ potential pinning layer 108 can also provide negative carriers to combine with the traps at front side interface 101a between oxide layer 107 and silicon substrate 106, to further reduce the dark current generated at that interface.

Further, the p+ floating diffusion region 104 is included in the n-well 109. With n-well 109 typically connected to a positive potential, n-well 109 can divert the photon generated positive charges into the photodiode potential well located in p region 105, to prevent or mitigate charge loss. The CMOS image sensor pixel structure 100 further includes an n region 111a that extends between potential pinning layer n+ layer 108 and n+ layer 102, to isolate the p regions (e.g., p region 105, p– region 103, etc.) of CMOS image sensor pixel structure 100 from the p regions of a neighboring pixel structure. Moreover, the CMOS image sensor pixel structure 100 also includes an n region 111b that extends between n-well 109 and the n+ layer 102, also to isolate p– region 103 from the p regions of a neighboring pixel structure.

As discussed before, one source of dark current is due to interface trapping. Such traps can be formed at, for example, back side interface 101a, as well as front side interface 101b. The generation of excessive dark current can be mitigated by reducing the interface states in back side interface 101, to improve the accuracy of CMOS image sensor pixel structure 100. As illustrated in FIG. 1, this can be accomplished by introducing the n+ layer 102 and the n+ potential pinning layer 108 to reduce the interface states generated dark current.

The n+ layer 102 can be formed using ion implantation, by imparting ions from the front side of silicon substrate 106 for them to reach the back side. However, it is difficult to form an n+ layer at the back side with high doping concentration using ion implantation. Moreover, a thick layer of n+ layer 102 is typically required to achieve the requisite doping concentration. However, a thick n+ layer 102 can degrade the sensitivity. This is because the positive carriers generated by photons entering from the back side surface can recombine with the negative carriers within n+ layer 102, instead of being collected in the potential well of the photodiode (PD) formed in region 105. Therefore, fewer positive carriers are generated for a certain amount of photons (which corresponds to a certain intensity of incident light), and the sensitivity of CMOS image sensor pixel structure 100 can be degraded as a result.

On the other hand, n+ layer 102 can also be formed by back side implant and thermal activation processes. However, both processes are complex and expensive.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Embodiments of the present disclosure provide an image sensor including at least one pixel for collecting charge in its photodiode is provided. The image sensor comprises a substrate having a first surface on a front side and a second surface on a back side, a photodetector formed in the silicon substrate and having a light-receiving surface on the second surface, and a first layer with positive charges disposed on the second surface, the first layer being configured to form an electron accumulation region at the light-receiving surface of the photodetector for suppressing a dark current at a back side interface of the image sensor.

In some embodiments, the image sensor further comprises a wiring layer disposed on the first surface.

In some embodiments, the image sensor further comprises a color filter on the first layer with positive charges disposed on the back side of the substrate.

In some embodiments, the image sensor further comprises one or more micro lenses disposed on the color filter on the back side of the substrate.

In some embodiments, the photodetector comprises a p-type layer.

In some embodiments, the image sensor further comprises an n-type doped surface pinning layer configured to suppress dark current generation at a front side interface of the image sensor.

In some embodiments, the image sensor further comprises a p-type doped floating diffusion region formed on the first surface of the substrate, and an n-type doped region formed between the floating diffusion region and the photodetector.

In some embodiments, the first layer with positive charges comprises silicon nitride.

In some embodiments, the image sensor further comprises an insulating layer disposed between a light-receiving surface and the first layer with positive charges. In some embodiments, the insulating layer is made of silicon dioxide.

In some embodiments, the image sensor further comprises a second layer with positive charges disposed on the first surface of the substrate. In some embodiments, the second layer with positive charges comprises silicon nitride.

Embodiments of the present disclosure also provide a method of fabricating an image sensor. The method comprises: introducing p-type dopants on a first surface of a silicon wafer to form one or more p-type regions; introducing n-type dopants on the first surface of the silicon wafer to form an n+ potential pinning layer; depositing a layer of silicon dioxide and one or more poly gates on the first surface of the silicon wafer; flipping the silicon wafer; thinning the silicon wafer to form a second surface opposite to the first surface; depositing a first layer of silicon dioxide on the second surface; and depositing a first layer of silicon nitride on the first layer of the first layer of silicon dioxide. The second surface is configured as a light-receiving surface of the image sensor.

In some embodiments, the method further comprises: depositing a second layer of silicon dioxide on the n+ potential pinning layer; and depositing a second layer of silicon nitride on the second layer of silicon dioxide.

In some embodiments, the method further comprises: forming at least one of: a color filter layer, and a micro-lens, on the first layer of silicon nitride.

It should be understood that both the foregoing general description and the following detailed description are only exemplary and are not restrictive of the invention.

BRIEF DESCRIPTION OF THE DRAWINGS

The accompanying drawings, which are incorporated in and constitute a part of this specification, illustrate embodiments consistent with the invention and, together with the description, serve to explain the principles of the invention.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

As discussed before, dark current generation, formed at interface traps, can degrade the performance of a back side illuminated CMOS image sensor. While an n+ layer can be formed at a back side surface of the sensor to reduce the interface traps, it is difficult to form the n+ layer at the back side surface using ion implantation and back side implant and thermal activation processes. Moreover, the n+ layer can include negative charges that recombine with the positive charges generated by the incident photons, which can lead to a degradation in the sensitivity of the CMOS image sensor.

One of the objectives of the present disclosure is to illustrate a solution to improve the performance of back side illuminated CMOS sensor under the current technologies. Embodiments of the present disclosure provide a pinned photodiode structure in CMOS image sensor array that includes a positive-charged layer to suppress the dark current at back side surface. The positive-charged layer can be, for example, a silicon nitride film (common anti-reflecting layer), and can be configured as an anti-reflecting layer.

Another objective of the present disclosure is to illustrate a fabrication process of a back side illuminated CMOS image sensor array, in which a positive-charged layer (e.g., silicon nitride film is formed as an anti-reflecting layer on the back side of the sensor array.

Figure 2A:
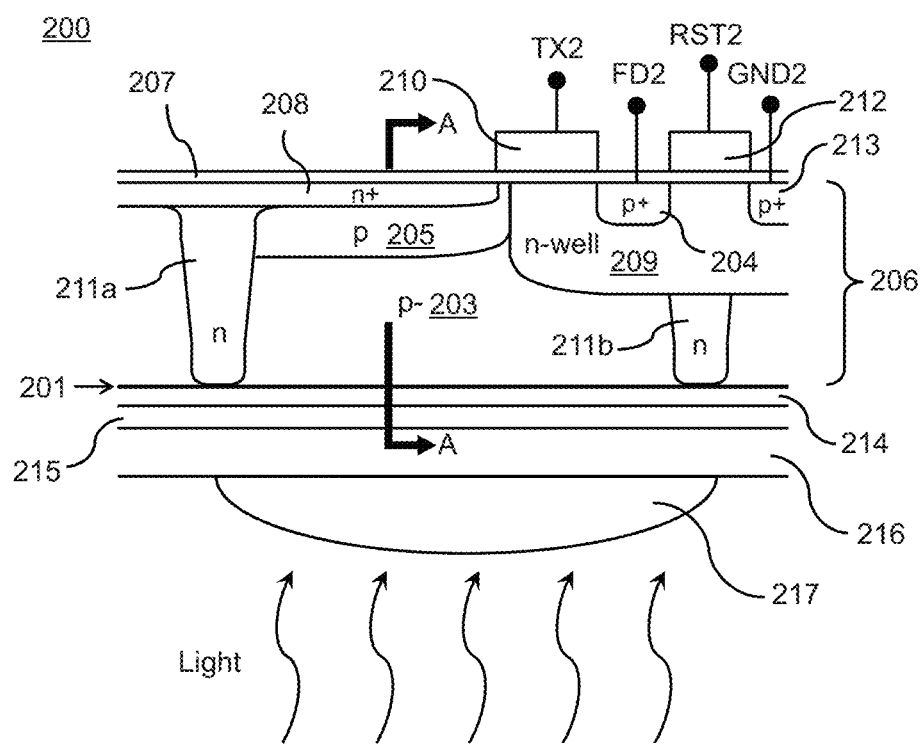
FIG. 2A illustrates a cross-sectional side view of an exemplary image sensor pixel device, according to embodiments of the present disclosure.

FIG. 2A illustrates a cross-sectional diagram of an exemplary image sensor pixel structure 200, according to embodiments of the present disclosure. As shown in FIG. 2A, CMOS image sensor pixel structure 200 includes a plurality of pixel regions including, for example, a p+ floating diffusion region 204, a p region 205, and a first charge transfer gate 210. CMOS image sensor pixel structure 200 also includes a second charge transfer gate 212 and a p+ region 213. Both p+ floating diffusion region 204 and p+ region 213 are in an n-well 209 and, together with second charge transfer gate 212, can form a PMOS device.

Photons can enter CMOS image sensor pixel structure 200 when the pixel structure 200 is exposed to light, which can lead to formation of positive charges in p region 205. A FD2 terminal can be connected to p+ floating diffusion region 204 on a front side of CMOS image sensor pixel structure 200, and a TX2 terminal can be connected to first charge transfer gate 210 on the front side. During the integration cycle, a voltage can be applied to TX2 terminal to enable a transfer of the charges formed in p region 205 to p+ floating diffusion region 204. Charges stored at the parasitic capacitors of p+ floating diffusion region 204 can develop a voltage. Terminal FD2 can be connected to a buffer amplifier (e.g., a Source Follower (SF)), which can be configured to sense the voltage developed at p+ floating diffusion region 204, and to drive the sense lines with a digital signal equivalent to the sensed voltage. Moreover, a GND2 terminal can be connected to p+ region 213 on the front side, and a RST2 terminal can be connected to second charge transfer gate 212 on the front side. GND2 terminal can be connected to a fixed bias voltage with a value of, for example, zero volts. At the end of the integration cycle, a voltage can be applied to RST2 terminal to enable a transfer of the charges in p+ floating diffusion region 204 to p+ region 213, to reset p+ floating diffusion region 204 for accumulation of new charges in the next integration cycle.

As shown in FIG. 2A, CMOS image sensor pixel structure 200 further includes a silicon substrate 206. The front side of silicon substrate 206 is covered by an oxide layer 207 configured to isolate first charge transfer gate 210 from the silicon substrate 206. A front side interface 201a is formed between oxide layer 207 and silicon substrate 206. Silicon substrate 206 further includes a p− region 203 below p region 205, and an n+ potential pinning layer 208 above p region 205. A photodiode (PD) can be formed between, for example, a p region including p− region 203 and p region 205, and an n region including n+ potential pinning layer 208. Photons can enter CMOS image sensor pixel structure 200 from the back surface and generate carriers in the p− region 203. The charges of these carriers are collected in the potential well of the photodiode (PD) formed in p region 205. The charges can then be transferred, via charge transfer gate 210, to the floating diffusion region 204.

Further, the p+ floating diffusion region 204 is included in the n-well 209. With n-well 209 typically connected to a positive potential, n-well 209 can divert the photon generated positive charges into the photodiode potential well located in p region 205, to prevent or mitigate charge loss. The CMOS image sensor pixel structure 200 also includes an n region 211a that extends from potential pinning layer n+ layer 208 and across p region 205 and p− region 203, to isolate the p regions (e.g., p region 205, p− region 203, etc.) of CMOS image sensor pixel structure 200 from the p regions of a neighboring pixel structure. Moreover, the CMOS image sensor pixel structure 200 also includes an n region 211b that extends from n-well 209 and across p− region 203, also to isolate p− region 203 from the p regions of a neighboring pixel structure.

CMOS image sensor pixel structure 200 further includes, on the back side, an insulating layer 214, an anti-reflecting layer 215, color filter elements 216, and a micro lens 217. Insulating layer 214 further insulates silicon substrate 206 from the external environment around the back surface. A back side interface 201b is formed between insulating layer 214 and p− region 203. Anti-reflecting layer 215, color filter elements 216, and micro lens 217 are configured to control one or more attributes of light that enters silicon substrate 206. For example, light incident on the back side can be directed to p− region 203 and p region 205 by micro lens 217 to form p-type carriers. Color filter elements 216 are arranged over p− region 203 and p region 205, and typically act as band pass filters so that p-type carriers are generated at p− region 203 and p region 205 only by light of certain wavelength ranges. For example, one color filter element permits light in the wavelength range corresponding to red light to enter p− region 203 and p region 205 to generate the carriers, while an adjacent color filter element allows light propagating in the wavelength range corresponding to green light to generate the carriers.

The anti-reflecting layer 215 can prevent the incident light on the back side from reflecting at the back side interface 201b between silicon substrate 206 and insulating layer 214, to reduce incident light loss. Anti-reflecting layer 215 can include positive charges. The positive charges can be introduced in anti-reflecting layer 215 by, for example, introducing silicon-nitride into anti-reflecting layer 215 during the fabrication process. As a result, anti-reflecting layer 215 can attract electrons and cause them to accumulate near interface 201b. The accumulated electrons can then recombine with the traps at the interface, thereby avoiding the p-type carriers generated by the photons from combining with the traps, and the generation of dark current due to interface state can be reduced.

In some embodiments, a silicon-nitride layer (not shown in FIG. 2A) can also be introduced above a portion of oxide layer 207 that is above potential pinning layer n+ layer 208. The silicon-nitride layer can provide positive charges to attract electrons, and to cause them to accumulate near interface between oxide layer 207 and potential pinning layer n+ layer 208. The electrons can also combine with the traps at the interface between oxide layer 207 and potential pinning layer n+ layer 208, to prevent these traps from combining with the p-type carriers generated by the photons. With such an arrangement, dark current at the interface between oxide layer 207 and silicon substrate 206 can be further reduced.

Figure 1:
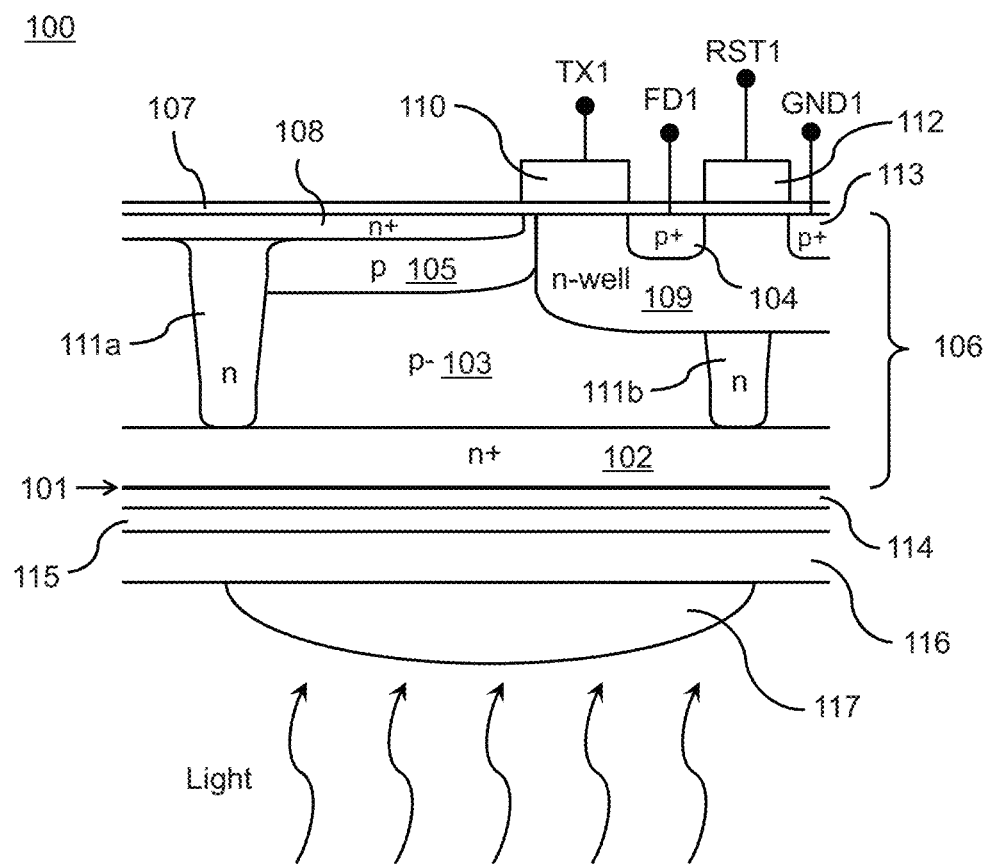
FIG. 1 illustrates a cross-sectional side view of an image sensor pixel in related art.

Further, in some embodiments, the n+ layer 102 as shown in FIG. 1 can also be eliminated from CMOS image sensor pixel structure 200, although it is not necessary. In a case where n+ layer 102 is eliminated, the degradation in image pixel sensitivity due to the thickness of n+ layer 102 (in order to achieve a requisite doping concentration) can also be eliminated. In some embodiments, other types of material can be used in place of silicon-nitride to include positive charges in anti-reflecting layer 215.

Figure 2B:
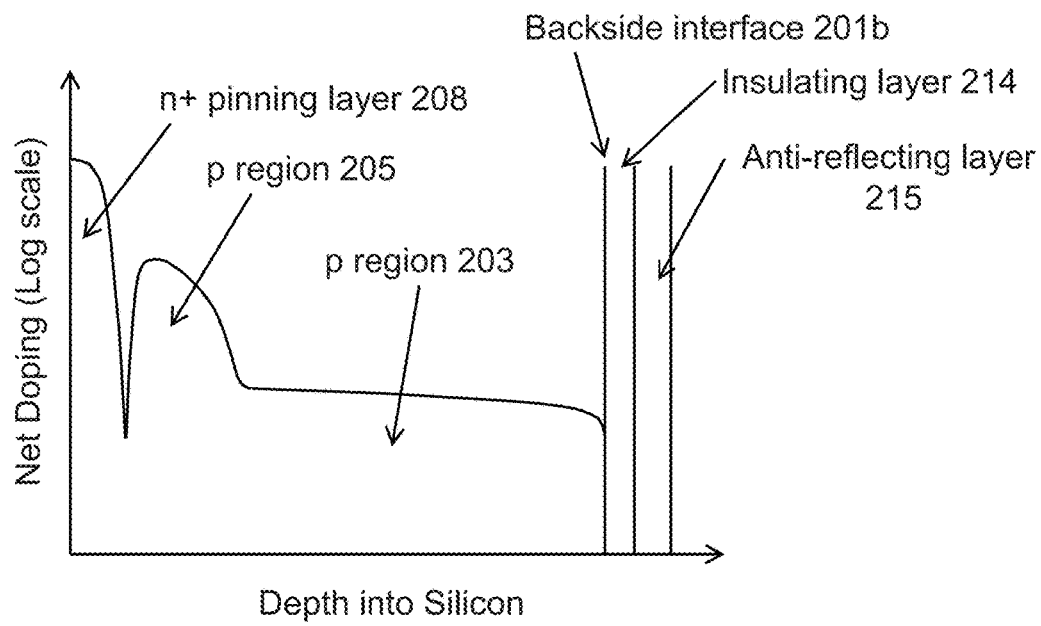
FIG. 2B illustrates a doping profile with respect to a depth of an exemplary image sensor pixel device, according to embodiments of the present disclosure.
Figure 2C:
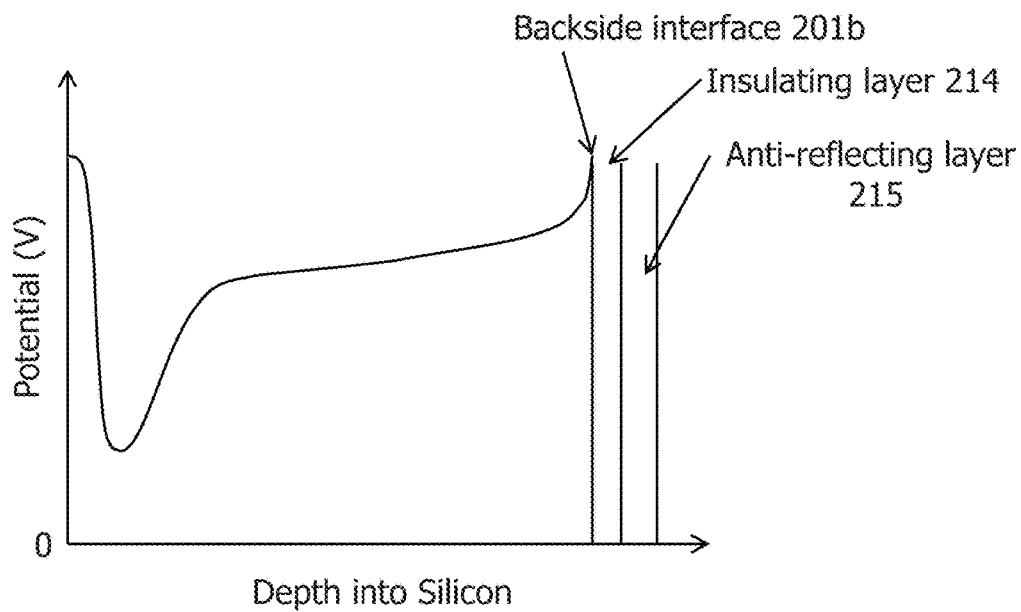
FIG. 2C illustrates an electric potential profile with respect to a depth of an exemplary image sensor pixel device, according to embodiments of the present disclosure.

FIGS. 2B and 2C illustrate a doping profile with respect to a depth of image sensor pixel device 200, according to embodiments of the present disclosure. The doping profile shown in FIG. 2B illustrates a variation of net doping concentration across the A-A cross-section as shown in FIG. 2A, with depth measured from oxide layer 207. The A-A cross-section spans n+ potential pinning layer 208, and p− region 203 and p region 205. With the removal of n+ layer 102 of FIG. 1, the doping profile stops at back side interface 201. FIG. 2C illustrates a variation of electric potential of different regions along the A-A cross section as shown in FIG. 2A.

Figure 3:
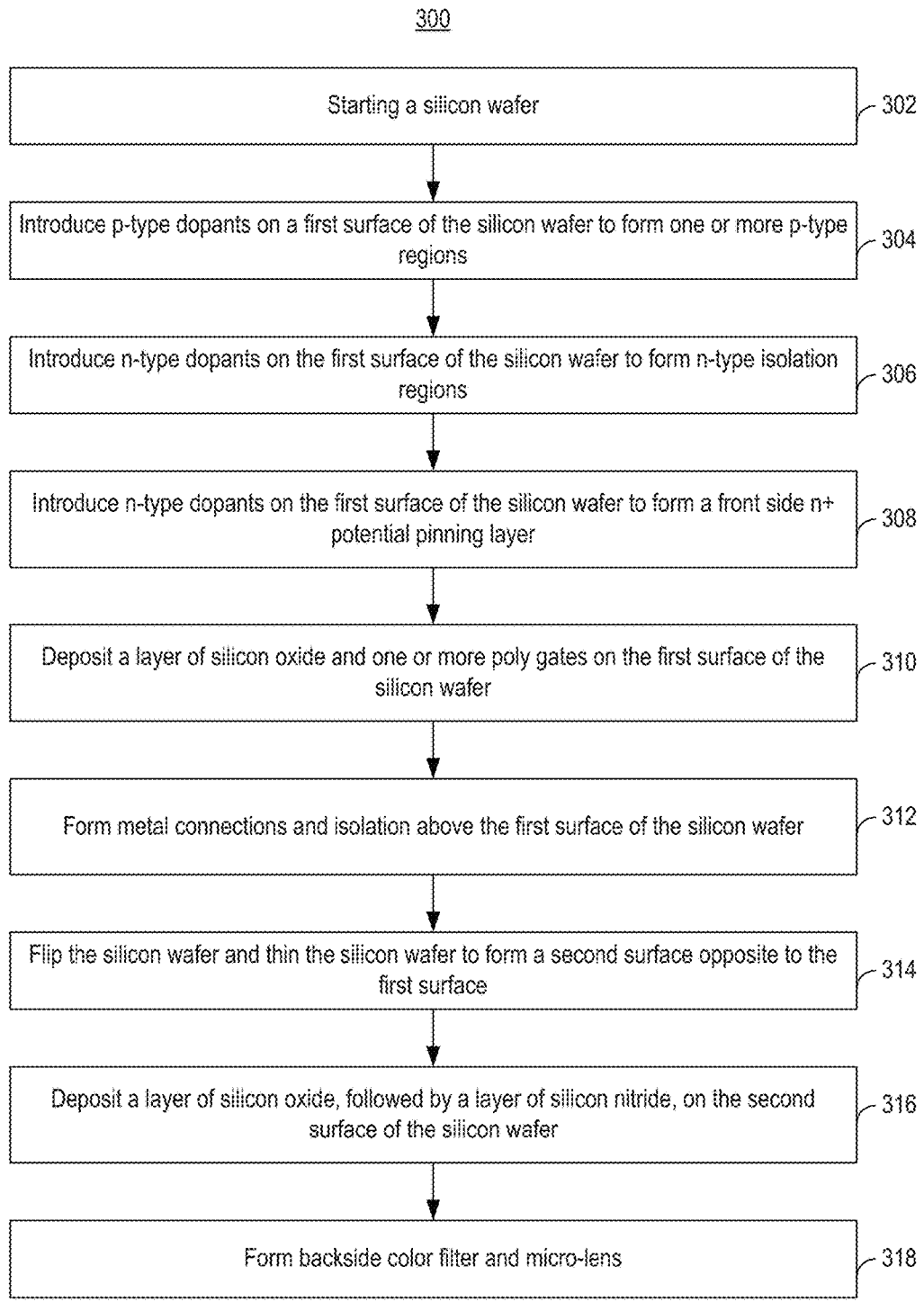
FIGS. 3 and 4A-4H illustrate an exemplary method of fabricating an image sensor pixel device, according to embodiments of the present disclosure.

Reference is now made to FIG. 3, which illustrates an exemplary method 300 for fabricating an image sensor pixel device, according to embodiments of the present disclosure. For example, method 300 can be performed to fabricate CMOS image sensor pixel structure 200 of FIG. 2A. For the following disclosure, method 300 is described in conjunction with FIGS. 4A-4E, which illustrate the cross section of a CMOS image sensor pixel structure (e.g., CMOS image sensor pixel structure 200 of FIG. 2A) fabricated when certain steps of method 300 are performed.

Figure 4A:
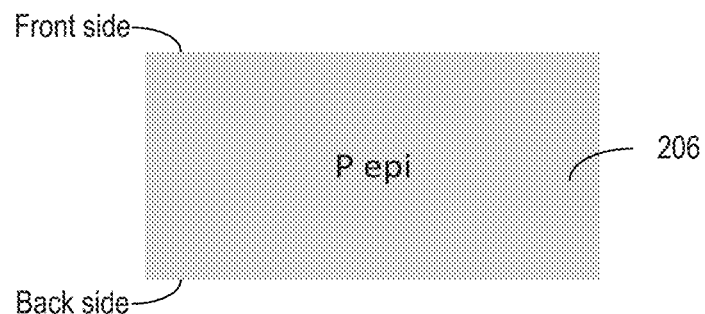

In step 302, a silicon wafer is prepared. The silicon wafer can be formed by, for example, depositing and growing a crystalline layer on a crystalline substrate to form a p-type epitaxy layer. The epitaxy can be formed using, for example, gaseous or liquid precursors. In some embodiments, as shown in FIG. 4A, silicon substrate 206 can be formed after step 302 is performed.

Figure 4B:
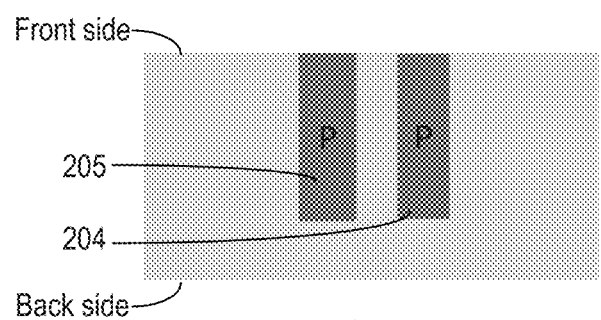

In step 304, p-type dopants can be introduced to silicon substrate 206 to form a plurality of p regions, such as p region 205 and p+ floating diffusion region 204. The dopants can be introduced, using ion implantation, on a front side surface of silicon substrate 206. FIG. 4B shows that silicon substrate 206 includes p region 205 and p+ floating diffusion region 204 after step 304 is performed.

Figure 4C:
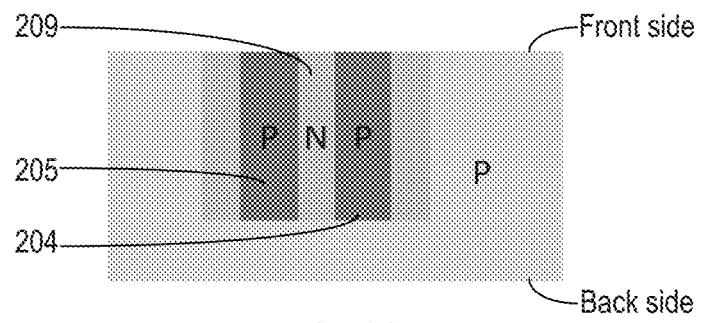

In step 306, n-type dopants can be introduced to silicon substrate 206 to form n regions, such as n-well 209, n regions 211a and 211b, etc. The dopants can be introduced on the front side surface of silicon substrate 206 using ion implantation. FIG. 4C shows that silicon substrate 206 further includes n-well 209 after step 306 is performed.

In step 308, an n-type pinning layer (e.g., n+ potential pinning layer 208) can be formed on the front side of silicon substrate 206 by, for example, ion implantation. In step 310, a silicon dioxide layer (e.g., oxide layer 207 of FIG. 2A) can be deposited on a front side surface 403, which is on the front side of silicon substrate 206. The oxide can be formed by, for example, heating silicon substrate 206 with front side surface 403 exposed to water or oxygen in an oxidation furnace. After the oxide is formed, one or more poly gates (e.g., first charge transfer gate 210) can be formed on oxide layer 207. The poly gates can be formed by depositing a layer of silicon using chemical vapor deposition, and then patterned using lithography to form the poly gates.

Figure 4D:
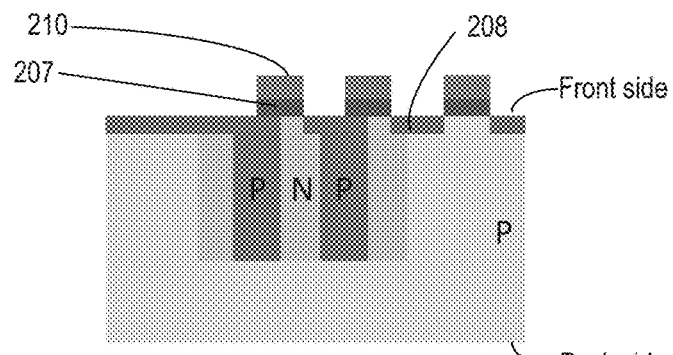
Figure 4E:
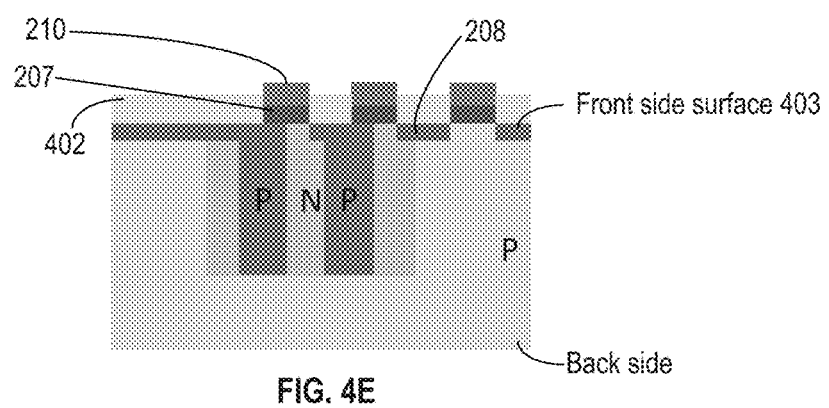

In some embodiments, a silicon nitride layer with oxide buffer 402 can also be formed above n+ potential pinning layer 208, in step 310. An oxide layer can be formed above n+ potential pinning layer 208, followed by introducing a silicon nitride using, for example, chemical vapor deposition. FIG. 4D shows that CMOS image sensor pixel structure 200 includes first charge transfer gate 210, oxide layer 207, and silicon substrate 206 comprising n+ potential pinning layer 208, after steps 308 and 310 are performed. FIG. 4E shows that CMOS image sensor pixel structure 200 further includes silicon nitride layer with oxide buffer 402 on front side surface 403, after step 310 is performed.

Figure 4F:
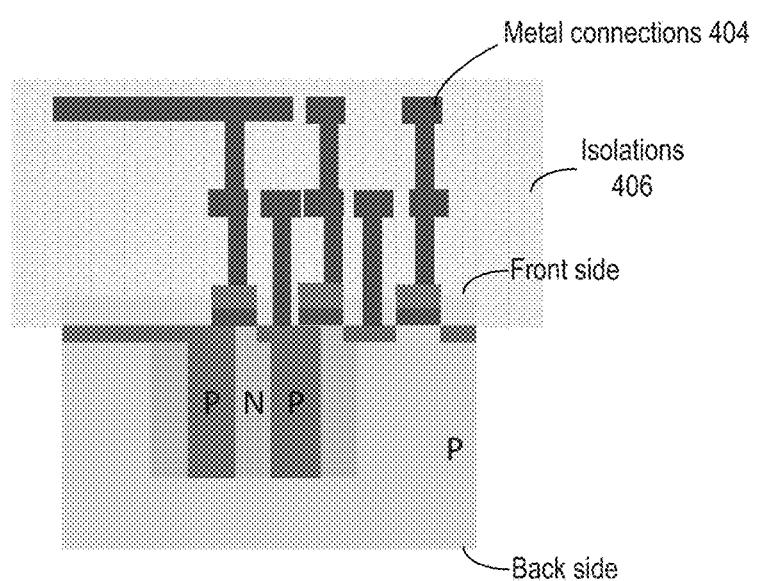

In step 312, metal connections 404 and isolations 406 are formed above front side surface 403 of silicon substrate 206. The metal connections can be formed by, for example, splputtering the metal (e.g., Aluminum) over the front side of silicon substrate 206. Metal connections 404 formed can be configured as, for examples, terminals TX2, FD2, RST2, and GND2 of FIG. 2A. Isolations 406 between the metal connections can be formed by, for example, depositing silicon dioxide or any type of insulators between the metal connections. FIG. 4F shows that CMOS image sensor pixel structure 200 further includes metal connections 404 and isolations 406 above front side surface 403 of silicon substrate 206 after step 312 is performed.

Figure 4G:
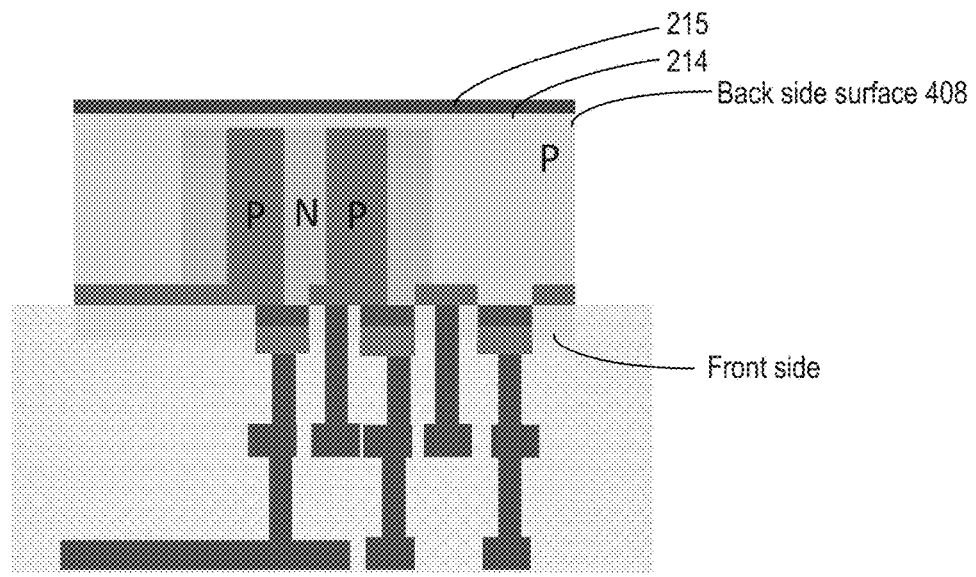

In step 314, CMOS image sensor pixel structure 200 is flipped, and silicon substrate 206 is thinned out to form a second surface (e.g., a back side surface 408) that is opposite to the front side surface. In step 316, a layer of silicon dioxide can be deposited on top of back side surface 408 to form, for example, insulating layer 214 of FIG. 2A. The insulating layer 214 can be, for example, an oxide layer formed by heating silicon substrate 206 with back side surface 408 exposed to water or oxygen in an oxidation furnace. After the insulating layer 214 is formed, anti-reflecting layer 215 with silicon nitride can be formed on top of insulating layer 214. The anti-reflecting layer can be formed by, for example, chemical vapor deposition, and can be configured as an anti-reflecting layer. FIG. 4G shows that CMOS image sensor pixel structure 200 comprises insulating layer 214 and anti-reflecting layer 215, after steps 314 and 316 are performed.

Figure 4H:
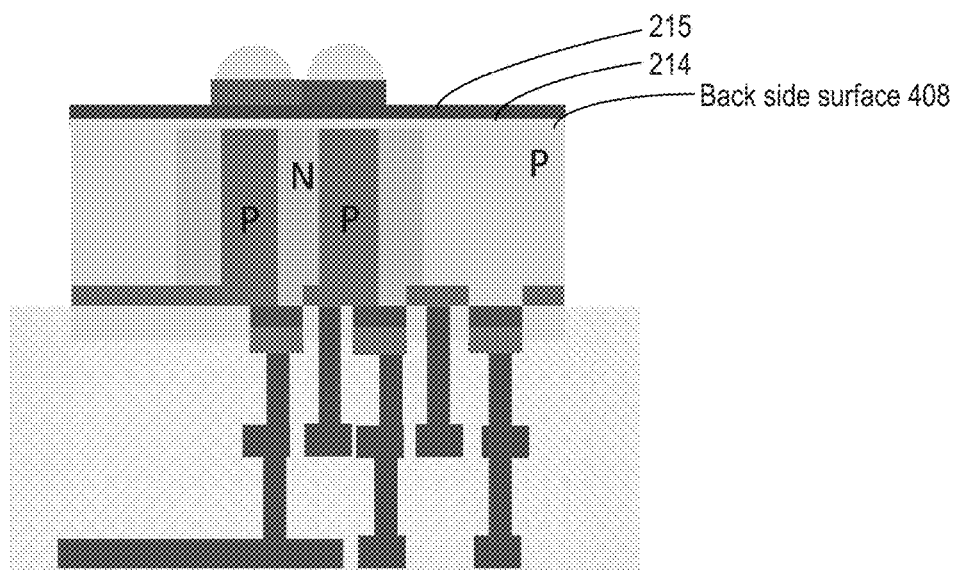

In step 318, back side color filter and micro-lens (e.g., color filter elements 216, and micro lens 217 of FIG. 2A) can be formed above anti-reflecting layer 215. The color filter and micro-lens can be formed by, for example, spin-on coating of liquid chemical material, followed by thermal steps to drive out the solvent, and then photo patterning the coated material. FIG. 4H shows that shows that CMOS image sensor pixel structure 200 comprises color filter elements 216 and a micro lens 217, after step 318 is performed.

With embodiments of the present disclosure, the generation of dark current at a back side interface can be reduced, and higher sensitivity can be achieved. Moreover, the complexity and cost of fabrication can also be reduced. Therefore, with embodiments of the present disclosure, high-performance image sensor devices can be fabricated in a cost-effective manner.

Other embodiments of the invention will be apparent to those skilled in the art from consideration of the specification and practice of the invention disclosed herein. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. An image sensor including at least one pixel for collecting charge in its photodiode, comprising:
   a substrate having a first surface on a front side and a second surface on a back side;
   a photodiode formed in the substrate and having a light-receiving surface on the second surface; and
   a first positively-charged layer disposed over the second surface and outside the substrate, the first positively-charged layer being configured to attract electrons in the substrate to accumulate at the second surface of the photodiode for suppressing dark current of the image sensor, wherein:
   the photodiode comprises a p− region and a p region,
   the p− region and the p region are configured to receive light and generate carriers in response to the received light, and
   at least a portion of the second surface is a surface of the p− region.

2. The image sensor of claim 1, wherein the first positively-charged layer is a silicon nitride layer.

3. The image sensor of claim 1, further comprising a color filter on the first positively-charged layer.

4. The image sensor of claim 3, further comprising one or more micro lenses disposed on the color filter.

5. The image sensor of claim 1, further comprising an n-type doped pinning layer, at least a portion of the first surface being a surface of the pinning layer.

6. The image sensor of claim 1, further comprising a p-type doped floating diffusion region formed on the first surface of the substrate, and an n-type doped region formed between the floating diffusion region and the photodiode.

7. The image sensor of claim 1, wherein the first positively-charged layer is an anti-reflection layer.

8. The image sensor of claim 1, further comprising an insulating layer disposed between the second surface and the first positively-charged layer.

9. The image sensor of claim 8, wherein the insulating layer is made of silicon dioxide.

10. The image sensor of claim 1, further comprising a second positively-charged layer disposed over the first surface of the substrate.

11. The image sensor of claim 10, wherein the second positively-charged layer is a silicon nitride layer configured to attract electrons in the substrate to accumulate at the first surface, causing dark current suppression at the first surface.

12. A method of fabricating an image sensor, comprising:
   introducing p-type dopants on a first surface of a silicon wafer to form one or more p-type regions;
   introducing n-type dopants on the first surface of the silicon wafer to form an n+ potential pinning layer;
   depositing a layer of silicon dioxide and one or more poly gates on the first surface of the silicon wafer;
   flipping the silicon wafer;
   thinning the silicon wafer to form a second surface opposite to the first surface;
   depositing a first layer of silicon dioxide on the second surface;
   depositing a first layer of silicon nitride on the first layer of silicon dioxide;
   depositing a second layer of silicon dioxide on the n+ potential pinning layer; and
   depositing a second layer of silicon nitride on the second layer of silicon dioxide, wherein the second surface is configured as a light-receiving surface of the image sensor.

13. The method of claim 12, further comprising:
forming at least one of: a color filter layer, and a microlens, on the first layer of silicon nitride.

14. An image sensor including at least one pixel for collecting charge in its photodiode, comprising:
- a substrate having a first surface and a second surface away from the first surface, the substrate comprising a photodiode configured to receive light via the second surface; and
- a first positively-charged layer disposed over the second surface and outside the substrate, the first positively-charged layer being configured to attract electrons in the substrate to accumulate at the second surface, causing dark current suppression at the second surface, wherein:
  the photodiode comprises a p– region and a p region,
  the p– region and the p region are configured to receive light and generate carriers in response to the received light, and
  at least a portion of the second surface is a surface of the p– region.

15. The image sensor of claim 14, wherein the first positively-charged layer is a silicon nitride layer.

16. The image sensor of claim 14, further comprising a second positively-charged layer disposed over the first surface of the substrate.

17. The image sensor of claim 16, wherein the second positively-charged layer is a silicon nitride layer configured to attract electrons in the substrate to accumulate at the first surface, causing dark current suppression at the first surface.

\* \* \* \* \*